United States Patent [19]

Shambelan

[11] 4,185,585

[45] Jan. 29, 1980

[54] APPARATUS FOR SIMULTANEOUSLY PROCESSING A PLURALITY OF SUBSTRATES

[75] Inventor: Robert C. Shambelan, Bridgewater, N.J.

[73] Assignee: RCA Corporation, New York, N.Y.

[21] Appl. No.: 913,240

[22] Filed: Jun. 6, 1978

Related U.S. Application Data

[63] Continuation-in-part of Ser. No. 790,197, Apr. 25, 1977, abandoned.

[51] Int. Cl.² .......................... B44D 1/34; C23F 1/34; C23F 1/44
[52] U.S. Cl. .................................. 118/50.1; 118/319; 118/320
[58] Field of Search .................... 118/50.1, 320, 49.1, 118/319

[56] References Cited

U.S. PATENT DOCUMENTS

| | | | |
|---|---|---|---|
| 3,974,797 | 8/1976 | Hutson | 118/320 |
| 4,008,683 | 2/1977 | Rose | 118/49.1 |
| 4,030,622 | 6/1977 | Brooks et al. | 118/50.1 |

*Primary Examiner*—Bernard D. Pianalto
*Attorney, Agent, or Firm*—H. Christoffersen; D. S. Cohen; R. A. Hays

[57] ABSTRACT

An apparatus for simultaneously processing a plurality of substrates comprises at least one novel chamber wherein at least one processing step is performed. Each chamber contains a plurality of spindles each having a substrate receiving surface upon which a substrate may be placed. Each of the spindles is at a different height from the floor of the chamber. Preferably the spindles are aligned in a single row according to height. Further, the chamber is provided with means for dispensing processing materials thereinto. The apparatus further comprises means for delivering a plurality of substrates to and from the processing chamber.

28 Claims, 8 Drawing Figures

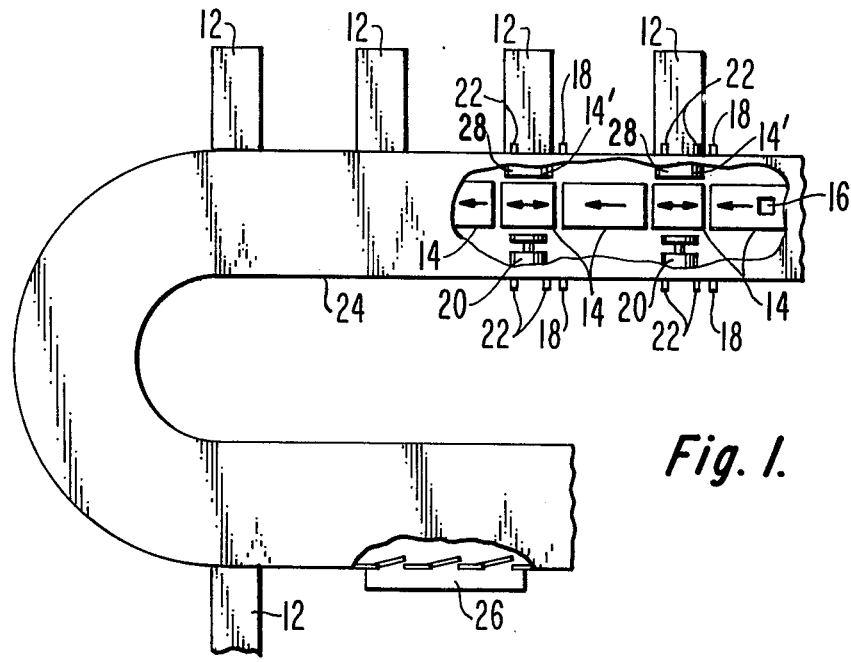
Fig. 1.
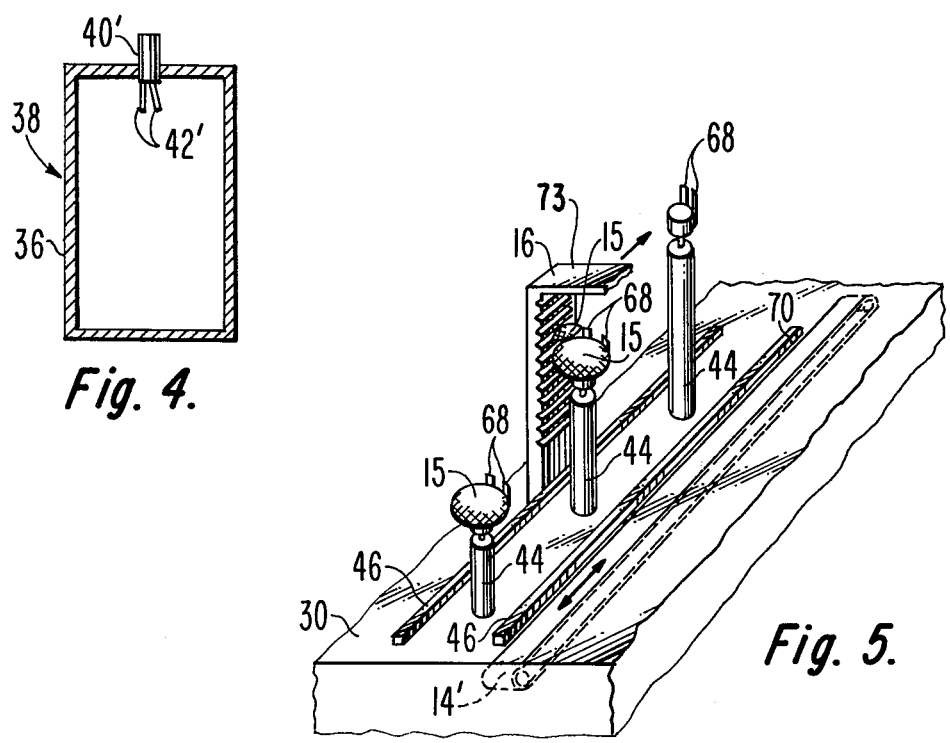
Fig. 4.
Fig. 5.

APPARATUS FOR SIMULTANEOUSLY PROCESSING A PLURALITY OF SUBSTRATES

This patent application is a continuation-in-part of United States patent application Ser. No. 790,197 filed Apr. 25, 1977 and now abandoned.

The present invention relates generally to the simultaneous processing of a plurality of substrates and, in particular, relates to an apparatus for such processing having at least one chamber wherein at least one processing step is performed.

The outputs of conventional semiconductor device fabrication systems are usually limited by the number of substrates, for example semiconductor wafers, which can be simultaneously worked on during particular processing steps. For example, during the processing of semiconductor wafers, a photoresist step, i.e., the forming of a layer of photoresist material on a surface of a semiconductor wafer, is repeatedly performed. One known method of performing this step is to place the photoresist, in its fluid state, near the center of the wafer and then spin the wafer to distribute the photoresist across the wafer's surface. The usual methods of performing this photoresist step limit the number of wafers which can be simultaneously treated to about 4. Such a limitation reduces the overall efficiency of the complete system.

Another disadvantage of known semiconductor device fabrication systems is that during batch processing, i.e., when a group of semiconductor wafers are processed together in a conventional cartridge, the edges of the semiconductor wafer are poorly processed because they are in constant contact with the cartridge. As a result the edges of the wafers so contacted cannot be used for semiconductor devices. Thus, the overall semiconductor device output of such systems is reduced.

The novel apparatus embodying the present invention can provide a semiconductor wafer processing system which substantially eliminates the aforementioned problems.

In the drawing:

FIG. 1 is a partial plan view of a system comprising the novel apparatus, not drawn to scale, embodying the present invention;

FIG. 4 is a cross-sectional view of a novel secondary chamber, not drawn to scale;

FIG. 5 is a perspective view of a row of novel wafer spindles, not drawn to scale;

Figure 2:
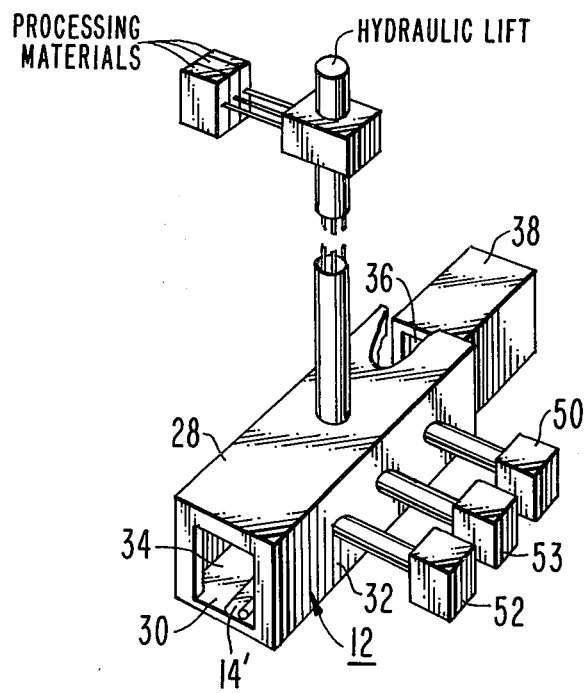
FIG. 2 is a perspective view of a novel processing chamber, not drawn to scale.

A system embodying the present invention, indicated generally at 10 in FIG. 1, comprises at least one processing chamber 12, which is described in more detail below. Preferably, the system 10 has a plurality of chambers 12, each of which corresponds to a particular step in the overall substrate fabrication process. Although the discussion hereinafter is specifically directed to semiconductor wafers it will be understood that the principles of the present invention can be equally adapted to almost any substrate processing. That is, there can be a separate chamber 12 for each etching step, a separate chamber 12 for each photoresist step and so on. Alternatively, there can be a single chamber 12 wherein all photoresist steps are performed, a single chamber 12 wherein all etching steps are performed, and so on.

The system 10 further comprises means 14 for delivering a plurality of wafers to and from the chamber 12. Such means 14 may be a cartridge 16 containing a plurality of wafers 15 from one processing chamber 12 to another processing chamber 12 as well as means 14' for conveying the cartridge 16 into and out of each processing chamber 12. As shown in FIG. 1, the main conveying means 14 can be comprised of a series of conveyor belts. Alternatively, it can be a railroad track apparatus (not shown) having a chain conveyer which hooks onto the cartridge 16 containing the semiconductor wafers 15. The cartridge 16 mentioned above is more fully discussed hereinafter.

The system 10 can have means 18 for controlling which particular processing chambers 12 the cartridge 16 is conveyed to and further comprises means for controlling the sequence of such conveyance. One way of accomplishing these tasks is to utilize a dedicated computer mechanism (not shown) to control and monitor the motors (also not shown) which operate the conveyor belts. The position of the cartridge 16 at any given point can, in that instance, be sensed, e.g., by photoelectric eyes, and fed into the computer mechanism. The cartridge 16 can also be transferred from the main conveying means 14 to a sub-conveying means 14' by means of a control arm 20. For example, when the cartridge is to enter a particular processing chamber 12 it is delivered to a comparatively short segment of belt in front of that chamber 12 and aligned with a set of rails, discussed below, and the sub-conveying means 14' by using a set of processing chamber sensors 22 to cause the motors controlling the comparatively short segment of belt to be jogged in either direction until the cartridge 16 is properly positioned. When the cartridge 16 is properly aligned a control arm 20 can be activated to direct the cartridge 16 from the comparatively short segment of belt 14 to the sub-conveying means 14' which then conveys the cartridge 16 into the chosen chamber 12. This process is reversed to return the cartridge 12 to the main conveying means 14 after the processing within the chamber 12 is completed. That is, the same control arm 20 can be used to direct the cartridge 16 from the sub-conveyer means 14' to the main conveyer means 14. The retraction of the cartridge from the sub-conveyor means 14' can be accomplished by any means known in the art. For example, while the control arm 20 is depicted in the drawing to be a piston-shaped pushing mechanism it can, in practice, comprise arms (not shown) which can grasp the cartridge 16. Alternatively, the cartridge 16 can have a magnetic label thereon and the control arm 20 can be an electromagnet which is energized to secure the cartridge 16 thereto during the return step. Yet another mechanism which can be used during the return of the cartridge 16 from the sub-conveyor 14' to the conveyor 14 is to provide an opening through the control arm 20 through which a vacuum may be applied to hold the cartridge 16 thereto. In addition, there can also be means for controlling the time which the wafers 15 spend in each processing chamber 12. The time which wafers 15 spend in the various chambers 12 is, of course, dependent upon the process step which is performed within that particular processing chamber 12.

In the preferred embodiment, the delivering means 14 of the system 10 is designed and adapted to interface with deposition and/or diffusion furnaces 24. Since such furnaces 24 require relatively high temperatures, such as, on the order of about 1200° C., and since it is unnecessary to reach such temperatures within the present novel processing chamber 12, such interfacing is advantageous to the overall efficiency of the system 10.

The control means discussed above may be either manual or automatic. In the manual version the cartridge 16 is picked up by an operator and placed in the desired processing chamber 12. At this point the operator can activate the sub-conveyor 14' or move the cartridge 16 by hand. After the processing step the operator can remove the cartridge 16 from the processing chamber 12 and move it to the next work location. In the automated version a dedicated computer mechanism is programmed for all of the steps in the processing of the semiconductor wafers 15 and therefore controls not only the route of the cartridge 16 but also the time spent in each particular processing chamber 12.

In order to reduce the possibility of wafer contamination, the complete system 10 is preferably constructed in an air-tight tunnel 25. In addition, the interfaces between the chambers 12, the furnaces 24 or the like, with the system 10, can also be made air-tight by using conventional isolation techniques. Various work stations 26, such as for mask alignment, photoresist exposure or for wafer inspection can also be readily interfaced with the system 10.

Figure 3:
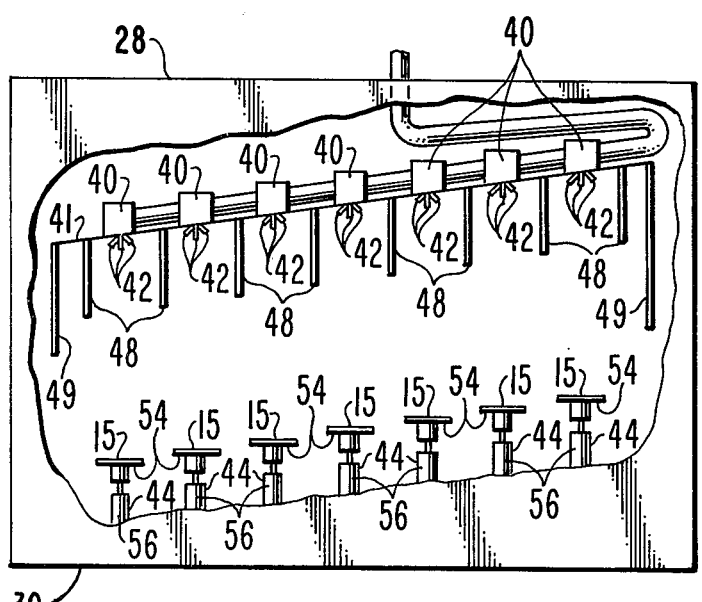
FIG. 3 is a cut-away view of the novel processing chamber, not drawn to scale.

The basis of the system 10, which is the novel processing chamber 12, discussed above, is now discussed in detail. Referring to FIGS. 2 and 3, the processing chamber 12 is comprised of a ceiling 28 and a floor 30 and wall means 32 therebetween and has an entrance 34 and an exit 36. It will be understood that the floor 30 of the chamber 12 need not be integrally connected to the wall means 32 thereof. As shown in the drawing the sub-conveyor means 14' is in the same plane as the floor 30. While only a single sub-conveyor 14' for each processing chamber 12 has been shown each chamber 12 can comprise a sub-conveyor on each side of the rails 46. The material of which the chamber 12 is constructed is dependent upon the particular processing step to be performed therein. Further, the processing chambers 12, using known techniques and materials, are preferably structurally designed to be capable of withstanding a positive pressurization of up to about 50 pounds per square inch.

In order to avoid contamination of the cartridge 16 during any particular processing step, an adjoining secondary chamber 38, shown in FIGS. 2 and 4 can be used in addition to the processing chamber 12 so that after the wafers 15 are distributed within the chamber 12 the cartridge 16, via sub-conveying means 14', is moved into the secondary chamber 38. The secondary chamber 38 can be adapted to spray a cleaning fluid over the cartridge 16 to maintain the integrity and reduce the contamination thereof.

A plurality of heads 40 are extendably and retractably affixed within the chamber 12. While each of the heads 40 can be individually affixed to the ceiling 28 of the chamber 12 it is preferred that all of the heads 40 be rigidly affixed to a single carrier plate 41 which can be moved in a direction vertically to the floor 30 of the chamber 12. That is, the carrier plate 41 is affixed in extensible relation to the ceiling 28 of the chamber 12. The plurality of heads 40 should be at least equivalent in number to the plurality of wafers 15 to be simultaneously processed. Each head 40 is preferably comprised of a set of nozzles 42, for example, three, each of which can be independently directed toward the floor 30 of the chamber 12 and each of which can be supplied with processing materials. The set of nozzles 42 are adapted to provide means for dispensing processing material into the chamber 12.

A plurality of spindles 44 more fully discussed below, are rigidly, but individually removably, affixed to the floor 30 of the chamber 12 such that each head 40 is substantially vertically aligned with and can be directed toward a single spindle 44. Each spindle 44 has, therefore, a set of nozzles 42 directed thereat.

In one embodiment a set of rails 46, shown in FIG. 5, are used to guide the cartridge 16 through the chamber 12. The rails 46 can be rigidly affixed to the floor 30 of the chamber 12 and positioned such that the cartridge 16, when aligned therewith, as more fully discussed below, passes over each one of the plurality of spindles 44.

To avoid cross-contamination between the wafers 15, baffle means 48, for example baffle plates, are provided which extend between each head 40 and serve to direct the sprays from each set of nozzles 42 toward a given single spindle 44. Thus, material dispensed from one head 40 toward one of the spindles 44 is substantially prevented from reaching the spindles 44 adjacent thereto. The carrier plate 41 can also have isolation means 49, for example isolation plates, which, when the carrier plate 41 is extended into the chamber 12, substantially completely seal the entrance 34 and exit 36 of the chamber 12. These isolation means 49 prevent the contamination of the rest of the system 10 and the secondary chamber 38 during the processing occurring in the chamber 12. The isolation plates 49 thus provide means for substantially completely isolating the atmosphere of the secondary chambers 38 from the atmosphere of the processing chamber 12.

Preferably, each chamber 12 is adapted with means 50 for controlling the pressure therein. That is, both a positive ambient pressure and a negative ambient pressure are available. Each processing chamber 12 is further provided with means 52 for controlling the ambient temperature therein, such as a thermostatically controlled heating element (not shown in detail). Additionally, means 53 for exhausting the atmosphere of the chamber 12 can be provided i.e., by way of a small fan or the like.

The processing chambers 12 can be adapted to perform most semiconductor processing steps, for example, to form a coating of photoresist on semiconductor wafers 15, to bake the photoresist coating and to develop and eventually remove the photoresist layer or coating. Further, the processing chambers 12 can be adapted to perform almost any etching step required in the fabrication of semiconductor devices. Finally, the chambers 12 can be utilized to perform the various cleaning steps which are an integral part of the processing of semiconductor devices. The specific examples stated above are only some of the various processing steps which can be performed within the novel chamber 12 and are not to be considered limiting in any fashion.

As mentioned above, each processing chamber 12, comprises a plurality of spindles 44 or means for supporting a plurality of semiconductor wafers 15. The number of spindles 44 should be at least equal to the number of wafers 15 to be simultaneously processed. Each spindle 44 has a wafer receiving surface 54 each of which is at a different height from the floor 30. Preferably, the spindles 44 are aligned in a single row by increasing heights. That is, the lowest wafer receiving surface 54 is nearest the entrance 34 of the processing chamber 12 and the spindle 44 having the highest wafer receiving surface 54 is located in the rear of the chamber 12 relatively close to the exit 36 as shown in FIGS. 3 and 5.

Figure 6:
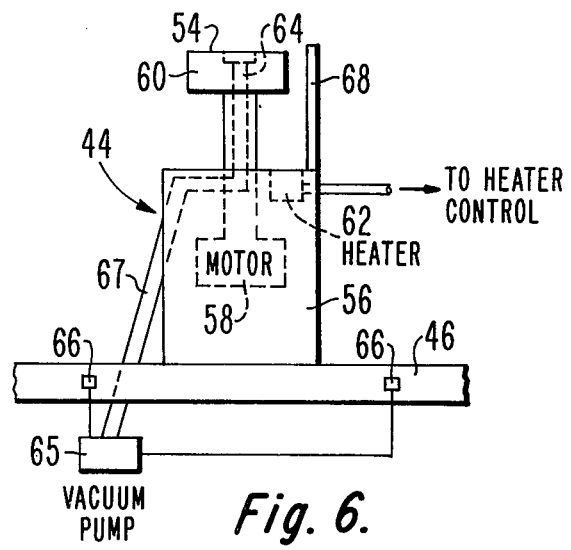
FIG. 6 is a detailed view of a single wafer spindle, not drawn to scale.

Each of the spindles 44, shown in detail in FIGS. 5 and 6, is comprised of a column-like base 56 which is rigidly affixed to the floor 30 of the processing chamber 12. Each column-like base 56 contains means 58 rotatably connected to an upper portion 60 of the spindle 44, for example a motor which is magnetically connected to the upper portion 60. The upper portion 60 comprises the wafer receiving surface 54.

Each spindle 44 further comprises a heating element 62, preferably positioned near the wafer receiving surface 54, for controlling the temperature of the wafer 15 thereon. Such a heating element 62 can be used, for example, for baking photoresist.

In the preferred embodiment, the spindles 44 comprise means 64 for retaining the wafer 15 on the wafer receiving surface 54, e.g., a vacuum means. As shown in FIG. 6 a vacuum can be created at the wafer receiving surface 54 by a vacuum pump 65 connected to the means 64 by a vacuum line 67. Such a means 64 provides a vacuum which retains a wafer 15 on the wafer receiving surface 54. Using known techniques, the spindles 44 can further comprise means 66 for detecting the approach of a wafer 15 to trigger the vacuum retention means 64. The detecting and triggering means 66 can be an electronic pressure switch or a vacuum sensor located, for example, on one of the rails 46 which is activated by the cartridge 16 as it passes thereover. By using such a detecting and triggering means 66 the wafer retaining means 64 is only operated when wafers 15 are to be processed in that chamber 12. Of course, such a means 66 can either be provided for each spindle 44 or a single switch can be used to trigger the means 64 for all the spindles 44.

The spindles 44 also contain means 68 for disengaging the semiconductor wafers 15 from the wafer cartridge 16. These disengaging means 68, as shown in FIGS. 5 and 6, can take the form of a pair of protrusions 68 on the side of the spindle 44 nearest the exit 36. Each pair of protrusions contacts a wafer 15 as the cartridge 16 passes over the spindle 44. The protrusions are designed such that, as the cartridge 16 passes over the spindles 44, each set of protrusions 68 prevents only the lowest wafer 15 in the cartridge 16 from moving toward the exit 36. As the cartridge 16 continues to move toward the rear of the chamber 12 the lowest wafer 15 is withdrawn therefrom and held to the wafer receiving surface 54 by the previously activated retention means 64. The protrusions 68 are preferably symmetrically located with respect to the wafer receiving surface 54 so that the semiconductor wafers 15 are centered thereon.

After distributing the wafers on the semiconductor wafer receiving surfaces 54 the cartridge 16 preferably activates a wafer presence sensor 70 which initiates the particular processing step involved. For example, a pressure sensor switch 70 may protrude from a wafer spindle 44, for example, the one with the lowest wafer receiving surface 54, which activates the carrier plate 41 and the heads 40 attached thereto. Preferably, in this instance, there is a time delay incorporated between the activation of the presence sensor 70 and the dispersal of material from the heads 40 so that all of the heads 40 are activated simultaneously after all of the wafers 15 are on their respective spindles 44. This wafer pressure sensor 70 can also be a pressure switch incorporated in the rails 46, as shown in FIG. 5, which is activated by the cartridge 16 after it has been emptied by the spindles 44 and is going into the secondary chamber 38. In this second mode there is no need for a time delay.

Figure 7:
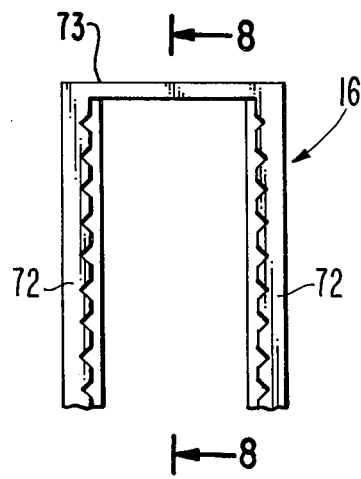
FIG. 7 is a frontal view of a wafer cartridge, not drawn to scale.
Figure 8:
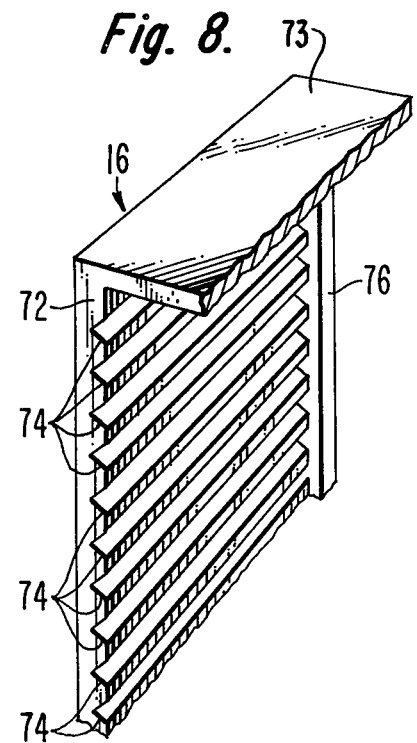
FIG. 8 is a cross-sectional view of the wafer cartridge of FIG. 7 taken along the line A—A thereof.

The cartridge 16, shown in detail in FIGS. 7 and 8 comprises two substantially parallel sides 72 which are rigidly spaced apart by upper wall 73. Means 74 is provided on each side 72 for supporting a plurality of wafers 15 in spaced apart vertical fashion. For example, the means 74 for supporting the wafers can be a plurality of grooves in the material comprising the sides 72. The grooves are spaced such that each wafer 15 is at a height which corresponds to a pair of protrusions 68 so that the wafer supported thereby is engaged by that pair of protrusions 68 as the cartridge 16 passes over the corresponding spindle 44.

The cartridge 16 is adapted to prevent the ingress and egress of wafers through one end thereof. That is, there is a means 76 which permits the wafers 15 to move into and out of the grooves through one end of the cartridge but prevents such movement through the other end. The means 76, which prevents such movement can be lips which extend inwardly from each of the sides 72 to produce a spatial relationship therebetween which is less than the diameter of the wafers 15 and greater than the spindles 44.

The remainder of the cartridge 16 is open so that it can move, when aligned with the rails 46 on the floor 30 of the chamber 12, over the plurality of spindles 44. Preferably, for most processing steps, the cartridge 16 can be made of a polystyrene plastic.

The size, shape and spacing of the grooves 74 along the sides 72 are designed so that the cartridge 16, when filled with semiconductor wafers 15 interfaces directly with present known diffusion carrier boats (not shown). This feature aids the transfer of wafers 15 from the cartridge 16 to diffusion carrier boats for diffusion or deposition processes.

The following example is intended only to facilitate the reader in understanding the interaction between the various apparatus portions of the system 10 and is not intended to be limiting. The example presented is for a photoresist processing step. The wafer cartridge 16 loaded with a plurality of wafers 15 is conveyed into a processing chamber 12 by the conveying means 14 and 14' and passes over the plurality of spindles 44. As shown in FIG. 5, as the cartridge 16 passes over each spindle 44 a semiconductor wafer 15 is extracted by the protrusions 68 of the spindle 44. Prior to contacting the protrusions 68, however, the cartridge 16 has passed over a retention activation means 66 to activate the vacuum 64 which, when the wafer is extracted from the cartridge 16, holds it on the wafer receiving surface 56 of the spindle 44. The wafer cartridge 16 also passes over, for example, a wafer presence switch 70 which activates a delaying mechanism to the plurality of heads 40 in the chamber 12. After all of the wafers 15 have been distributed on the plurality of spindles 44 the wafer cartridge 16 is conveyed into the secondary chamber 38. Upon entry into the secondary chamber 38 the wafer cartridge 16 activates a cleaning procedure wherein a head 40' having a set of nozzles 42' is activated and the cartridge 16 is sprayed with a cleaning fluid.

After a delay of a sufficient time which allows the wafer cartridge 16 to be conveyed into the secondary chamber 38, the carrier plate 41 is lowered and the heads 40, via the sets of nozzles 42, spray photoresist on the plurality of wafers 15. In order to more evenly distribute the photoresist on the wafers the motors 58 in the spindles 44 are activated to begin spinning the semiconductor wafer surfaces 54 and the wafers 15 thereon. Upon completion of the photoresist deposition the spinning is halted and the temperature means 62 within the spindles 44 is activated to heat the wafers 15 to a temperature on the order of about 200° C. to harden the photoresist.

After the photoresist has hardened the sub-conveyer means 14' brings the cartridge 16 out of the secondary chamber 38 along the rails 46 and across and over the plurality of spindles 44 whereby the wafers 15 are picked up by the cartridge 16. This pick up action occurs since the vacuum system has been shut off, for example by a set of switches similar to those which initially activated the vacuum, and because there are no protrusions on the front portion of the wafer spindles 44 to prevent the wafer movement in that direction. After picking up all of the wafers 15 the cartridge 16 is then conveyed, by conveying means 14, to a work station 26 whereat a photomask is placed over each wafer 15 and light radiation, usually ultraviolet light, is directed at the wafer 15 to polymerize portions of the photoresist.

After being photoradiated the wafers 15 are then conveyed to another chamber 12, or conceivably the same chamber 12 if only a single chamber 12 is utilized and again distributed onto spindles 44. The wafers 15 are sprayed with a developer solution that acts as an etchant on the photoresist which has not been exposed to light radiation and removes it from the surface of the wafer to define the photoresist pattern. Following the completion of the developing process and within the same chamber 12, if desired, the semiconductor wafers 15 on the spindles 44 can then be sprayed with a cleaning solution which cleans the surfaces of the wafers 15 in preparation for the following step.

The system 10 for the fabrication of semiconductor devices incorporating the principles of the present invention is advantageous in many respects. Primarily, the system 10 allows a large plurality of wafers 15 to be simultaneously processed. Another advantage is that during the actual batch processing the wafers 15 are not in a cartridge 16 and therefore the complete surface, including the edges of the wafers 15 are processed. This results in a larger device chip per wafer yield. Yet another advantage is that during the processing steps the wafers 15 need not be manually moved, removed or handled in any fashion and this reduces point defects which inherently occur when even the most careful person handles the wafer.

Since the system 10 described herein can be interconnected with a dedicated computer, it can be fully automated to reduce the time and manpower necessary to fabricate semiconductor devices. Further, since the spindles 44 are individually detachable, if something were to go wrong with one of them only that spindle 44 would need to be removed. This allows for either the individual replacement of a given single spindle 44 or at least the removal of that spindle 44 without shutting down or taking out of service the complete processing chamber 12. Of course, if a given spindle 44 is removed for repair the corresponding groove in the cartridge 16 should be left empty to prevent two wafers from being removed by the protrusions 68 of the following spindle 44. One other advantage which must necessarily be mentioned is that by using heads 40 having a plurality of nozzles 42, each of which can be fed with any type of material desired, this system 10 can be easily adapted to technological changes without having to redesign the complete processing chamber 12.

What is claimed is:

1. An apparatus for simultaneously processing a plurality of substrates comprising:
   a plurality of substrate spindles affixed to a floor of a processing chamber, each said spindle having a substrate receiving surface each of which is at a different height from said floor than every other said substrate receiving surface;
   means for delivering a plurality of substrates to said spindles;
   means associated with each said spindle for disengaging one of said substrates from said delivering means when said delivering means is passed over said spindle; and
   means for dispensing processing material into said chamber.

2. An apparatus as claimed in claim 1 wherein said means for dispensing processing material comprises a plurality of heads affixed in extensible relation to a ceiling of said chamber.

3. An apparatus as claimed in claim 1 wherein said means for dispensing processing material comprises a plurality of heads affixed to a carrier plate, said carrier plate being affixed in extensible relation to a ceiling of said chamber, each said head being adapted for dispensing material into said chamber.

4. An apparatus as claimed in claim 3 wherein:
   each said head comprises a plurality of nozzles.

5. An apparatus as claimed in claim 3 wherein:
   each said head is directed toward one of said spindles.

6. An apparatus as claimed in claim 3 wherein said carrier plate further comprises:
   baffle plates extending toward said floor of said chamber substantially separating each said head from each other said head, said baffle plates extending further from said ceiling than said heads whereby material dispensed from one of said heads toward one of said spindles is substantially prevented from reaching said spindles adjacent thereto.

7. An apparatus as claimed in claim 3 further comprising:
   a chamber entrance and a chamber exit; and
   isolation plates extending from said carrier plate, said isolation plates substantially blocking said entrance and said exit when said carrier plate is extended into said chamber.

8. An apparatus as claimed in claim 3 wherein:
   each head is directed toward one of said spindles and each said spindle has only a single head directed thereat; and
   means for detecting the presence of a substrate on said spindles.

9. An apparatus as claimed in claim 1 further comprising:
   means for maintaining a positive ambient pressure within said chamber.

10. An apparatus as claimed in claim 1 further comprising:
means for exhausting the atmosphere of said chamber.

11. An apparatus as claimed in claim 1 further comprising:
a secondary chamber attached to said processing chamber, said secondary chamber being accessible via said processing chamber by an aperture therebetween; and
means for substantially completely isolating said secondary chamber's atmosphere from said processing chamber's atmosphere.

12. An apparatus as claimed in claim 1 wherein:
said substrate spindles are aligned in a row.

13. An apparatus as claimed in claim 1 wherein:
each said substrate spindle is detachable from said floor.

14. An apparatus as claimed in claim 1 wherein:
each said substrate spindle has a column-like base and an upper portion having said substrate receiving surface, said upper portion being rotatably mounted to said column-like base.

15. An apparatus as claimed in claim 1 wherein:
each said substrate spindle comprises means for heating a substrate placed thereon.

16. An apparatus as claimed in claim 1 wherein:
each said substrate spindle comprises means for retaining a substrate thereon.

17. An apparatus as claimed in claim 1 wherein:
each said substrate spindle comprises means for detecting an approaching substrate; and
retaining means responsive to said detecting means for retaining said approaching substrate on said substrate spindle.

18. An apparatus as claimed in claim 1 wherein:
said substrate delivering means comprises a cartridge having first and second side members rigidly affixed in spaced apart relation, said side members comprising means for supporting a plurality of substrates in a vertically spaced apart relation.

19. An apparatus as claimed in claim 18 wherein: said means for supporting a plurality of substrates in a vertically spaced apart relation is a plurality of aligned grooves in said first and second side members.

20. An apparatus as claimed in claim 19 wherein:
said substrate delivering means further comprises a front side and a rear side; and
means for preventing the ingress or egress of a substrate into or out from said rear side.

21. An apparatus as claimed in claim 19 wherein:
said substrate spindles are aligned in a single row; and
at least one rail mounted on said floor of said processing chamber spaced apart from and substantially parallel with said row of substrate spindles, said spacing being such that when said first side of said cartridge is placed adjacent thereto and moved therealong said cartridge passes over said substrate spindles.

22. An apparatus as claimed in claim 21 wherein:
said substrate spindles are positioned in said row by increasing height, each said disengaging means associated with each said spindle substantially corresponding in height to a pair of said aligned grooves.

23. An apparatus as claimed in claim 22 wherein:
each said disengaging means is at least a pair of protrusions associated with and extending above each said substrate spindle such that a substrate supported by a pair of said aligned grooves engages said pair of protrusions and is disengaged from said substrate delivering means when said substrate delivering means is passed over said pair of protrusions in a rear to front direction.

24. An apparatus as claimed in claim 1 wherein said apparatus further comprises:
a plurality of said processing chambers; and
means for conveying a plurality of substrates in a single cartridge from one of said processing chambers to another of said processing chambers.

25. Apparatus for simultaneously processing a plurality of substrates comprising, in combination:
a processing chamber including conveyor means for conveying a cartridge entering one end of said chamber along the length thereof;
a plurality of spindles spaced along the length of said chamber, each spindle including, at a different height, a substrate receiving surface and a substrate disengaging means, the different substrate receiving surface being at successively higher levels starting with the one closest to said one end of the chamber; and
a cartridge which in use is conveyed by said conveying means along the length of said chamber, said cartridge having means for removably supporting a plurality of substrates, each at a different height corresponding to the different heights of said different substrate receiving surfaces and positioned so that said substrates can be engaged and removed by said substrate removing means, whereby when said cartridge loaded with substrates is conveyed along said chamber starting at said one end thereof, as it passes each spindle, first the substrate disengaging means on the spindle closest to said one end of said chamber removes the lowest substrate from said cartridge, then the substrate disengaging means on the next spindle removes the next higher substrate, and so on until all substrates have been removed from said cartridge.

26. Apparatus as claimed in claim 25 wherein said cartridge comprises two side walls formed with horizontal parallel grooves therein at different levels for removably supporting said substrates, said cartridge being open on its two other sides so that said substrates can be removed through these other sides by relatively moving them along the grooves in a horizontal plane, and each substrate disengaging means comprising a protrusion having an upper horizontal surface slightly higher than the upper surface of the substrate it is intended to remove for engaging said substrate as it attempts to move past these means, for causing said substrate to slide out of said cartridge and onto a said substrate receiving surface as said cartridge passes said substrate removing means.

27. Apparatus as claimed in claim 25 further comprising:
means for dispensing processing material into said chamber, said means comprising a plurality of heads fixed to a carrier plate, said carrier plate being placed in extensible relation to a ceiling of said chamber, each said head being directed toward one of said spindles and being adapted for dispensing material into said chamber.

28. Apparatus as claimed in claim 25 wherein each said spindle comprising a column-like base and an upper portion having said substrate receiving surface, said upper portion being rotatably mounted to said column-like base.

* * * * *